US012774159B2

(12) United States Patent
Lee et al.

(10) Patent No.: US 12,774,159 B2
(45) Date of Patent: Oct. 27, 2026

(54) ARTICLE TRANSFER AND STORAGE APPARATUS

(71) Applicant: Samsung Electronics Co., Ltd., Suwon-si (KR)

(72) Inventors: Sangkyung Lee, Suwon-si (KR); Seunggyu Kang, Suwon-si (KR); Hyunjae Kang, Suwon-si (KR); Youngwook Kim, Suwon-si (KR); Jaesung Byun, Suwon-si (KR); Yongjun Ahn, Suwon-si (KR); Minkyun Lee, Suwon-si (KR); Hyunwoo Lee, Suwon-si (KR); Jeonghun Lim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 391 days.

(21) Appl. No.: 18/529,445

(22) Filed: Dec. 5, 2023

(65) Prior Publication Data

US 2024/0253900 A1 Aug. 1, 2024

(30) Foreign Application Priority Data

Feb. 1, 2023 (KR) ........................ 10-2023-0013905
Feb. 20, 2023 (KR) ........................ 10-2023-0022445

(51) Int. Cl.

*B65G 1/04* (2006.01)
*B65G 1/137* (2006.01)
*H10P 72/30* (2026.01)

(52) U.S. Cl.

CPC ......... *B65G 1/0464* (2013.01); *B65G 1/1371* (2013.01); *H10P 72/3404* (2026.01)

(58) Field of Classification Search

None
See application file for complete search history.

(56) References Cited

U.S. PATENT DOCUMENTS 9,364,086 B2 * 6/2016 Takahara ............... A47B 81/00
9,385,019 B2 * 7/2016 Fosnight .............. B65G 1/0464
(Continued)

FOREIGN PATENT DOCUMENTS

KR 10-2012-0047772 A 5/2012
KR 10-2013-0108400 A 10/2013
(Continued)

OTHER PUBLICATIONS

Korean Office Action dated Aug. 26, 2026 for corresponding Korean Patent Application No. 10-2023-0022445 and its English-language translation.

*Primary Examiner* — Mark C Hageman
(74) *Attorney, Agent, or Firm* — HARNESS, DICKEY & PIERCE, P.L.C.

(57) ABSTRACT

An article transfer and storage apparatus includes a travel rail that includes a plurality of first rails extending in a first direction and spaced apart from each other in a second direction perpendicular to the first direction and a plurality of second rails extending in the second direction and spaced apart from each other in the first direction, a plurality of power transmission rails disposed above the travel rail, extending in the first direction, and spaced apart from each other in the second direction, a transfer robot that is configured to move on the travel rail in the first direction and the second direction to convey an article, the transfer robot including a battery charged by power provided from the plurality of power transmission rails, and storage shelves disposed below the travel rail.

20 Claims, 7 Drawing Sheets

(56) References Cited

U.S. PATENT DOCUMENTS

| | | | | |
|---|---|---|---|---|
| 10,497,594 | B2 | 12/2019 | Suzuki | |
| 10,586,721 | B2 * | 3/2020 | Murata | H10P 72/1924 |
| 10,913,601 | B2 * | 2/2021 | Suzuki | B65G 1/04 |
| 11,171,027 | B2 | 11/2021 | Ito | |
| 11,276,596 | B2 | 3/2022 | Torazawa et al. | |
| 11,377,310 | B2 | 7/2022 | Aust et al. | |
| 11,876,009 | B2 * | 1/2024 | Torazawa | B61B 3/02 |
| 2021/0162850 | A1 | 6/2021 | Ogo et al. | |
| 2022/0061609 | A1 * | 3/2022 | Nishikawa | A47L 7/0085 |
| 2022/0194248 | A1 | 6/2022 | Kalouche | |
| 2022/0384229 | A1 | 12/2022 | Kitamura et al. | |
| 2023/0365332 | A1 * | 11/2023 | Wada | B60L 5/00 |

FOREIGN PATENT DOCUMENTS

| | | | |
|---|---|---|---|
| KR | 10-2016-0106777 | A | 9/2016 |
| KR | 10-2021-0145675 | A | 12/2021 |
| KR | 10-2022-0066397 | A | 5/2022 |
| WO | 2022/149397 | A1 | 7/2022 |

* cited by examiner

ARTICLE TRANSFER AND STORAGE APPARATUS

CROSS-REFERENCE TO RELATED APPLICATION

This application is based on and claims priority under 35 U.S.C. § 119 to Korean Patent Application No. 10-2023-0013905, filed on Feb. 1, 2023, and 10-2023-0022445, filed on Feb. 20, 2023, in the Korean Intellectual Property Office, the disclosures of each of which are incorporated by reference herein in their entireties.

BACKGROUND

The inventive concepts relate to an article transfer and storage apparatus, and more particularly, to an article transfer and storage apparatus that includes a transfer robot.

In general, articles are conveyed by an overhead hoist transport (OHT) apparatus in a semiconductor manufacturing plant. The OHT apparatus includes overhead rails fixed to the ceiling of the semiconductor manufacturing plant and a vehicle moving along a path provided from the overhead rails. In the OHT apparatus, vehicles move only along a predetermined path. Accordingly, sections in which the vehicles are habitually congested occur, and it is difficult to secure spaces for storing articles on the ceiling side.

SUMMARY

The inventive concepts provide an article transfer and storage apparatus that includes a transfer robot.

According to an aspect of the inventive concepts, there is provided an article transfer and storage apparatus including a travel rail including, a plurality of first rails extending in a first direction and spaced apart from each other in a second direction perpendicular to the first direction, and a plurality of second rails extending in the second direction and spaced apart from each other in the first direction; a plurality of power transmission rails disposed above the travel rail, extending in the first direction, and spaced apart from each other in the second direction; a transfer robot that is configured to move on the travel rail in the first direction and the second direction to convey an article, the transfer robot including a battery charged by power provided from the plurality of power transmission rails; and storage shelves disposed below the travel rail.

According to another aspect of the inventive concept, there is provided an article transfer and storage apparatus including a travel rail including, a plurality of first rails extending in a first direction and spaced apart from each other in a second direction perpendicular to the first direction, and a plurality of second rails extending in the second direction and spaced apart from each other in the first direction; a plurality of power transmission rails disposed above the travel rail, extending in the first direction, and spaced apart from each other in the second direction; and a transfer robot configured to move on the travel rail in the first direction and the second direction, the transfer robot including a battery, a power receiving block, and a gripper for holding an article, wherein the battery of the transfer robot is configured to be continuously charged by electromagnetic induction generated between the power receiving block and the plurality of power transmission rails in response to the transfer robot moving in the first direction.

According to another aspect of the inventive concept, there is provided an article transfer and storage apparatus including a travel rail that includes, a plurality of first rails extending in a first direction and spaced apart from each other in a second direction perpendicular to the first direction, a plurality of second rails extending in the second direction and spaced apart from each other in the first direction, and a plurality of cell regions defined by the plurality of first rails and the plurality of second rails, wherein the travel rail is fixed to a ceiling wall by hanging posts; a plurality of power transmission rails disposed above the travel rail, extending in the first direction, and spaced apart from each other in the second direction; a transfer robot configured to move on the travel rail in the first direction and the second direction; and storage shelves disposed below the travel rail, wherein the transfer robot includes, a gripper configured to grip an article; a hoist mechanism configured to move the gripper in a vertical direction; a first tag reader configured to identify an identification tag of the article; a fall prevention structure configured to physically support the article held by the gripper; a particle collector configured to suction and collect particles; a power receiving block; a battery that is configured to be charged by electromagnetic induction generated between the power receiving block and the plurality of power transmission rails; and an actuator configured to move the power receiving block in the vertical direction between a first vertical level and a second vertical level, and wherein each of the storage shelves includes, a shelf plate on which the article is placed; a purge gas supply configured to inject a purge gas into the article; a second tag reader configured to identify the identification tag of the article; and a support pin provided on the shelf plate and configured to support the article.

BRIEF DESCRIPTION OF THE DRAWINGS

Example embodiments will be more clearly understood from the following detailed description taken in conjunction with the accompanying drawings in which.

DETAILED DESCRIPTION

Figure 1:
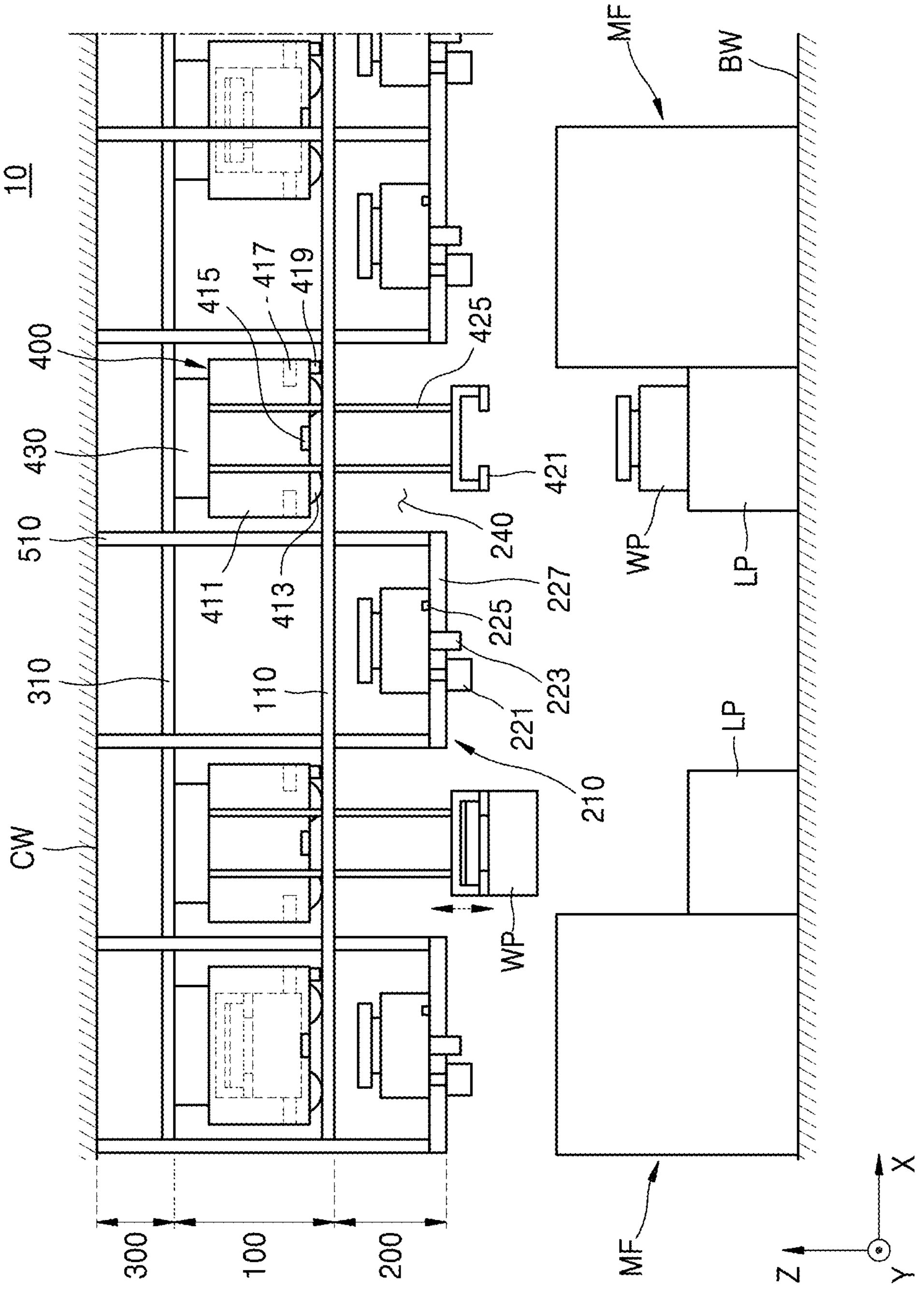
FIG. 1 is a configuration diagram showing an article transfer and storage apparatus according to some example embodiments.

Hereinafter, some example embodiments of the inventive concepts are described in detail with reference to the accompanying drawings. The same reference numerals are given to the same elements in the drawings, and repeated descriptions thereof are omitted.

As used herein, the vertical direction may be defined as a Z direction and first and second directions may be defined as directions perpendicular to the Z direction. The first direction may be referred to as an X direction and the second direction may be referred to as a Y direction. A vertical level may refer to a height level in the vertical direction (Z direction). The horizontal width may refer to a length in the horizontal direction (X direction and/or Y direction) and the vertical length may refer to a length in the vertical direction (Z direction). The horizontal conveyance may refer to conveyance in the horizontal direction (X direction and/or Y direction) and the vertical conveyance may refer to conveyance in the vertical direction (Z direction).

Figure 2:
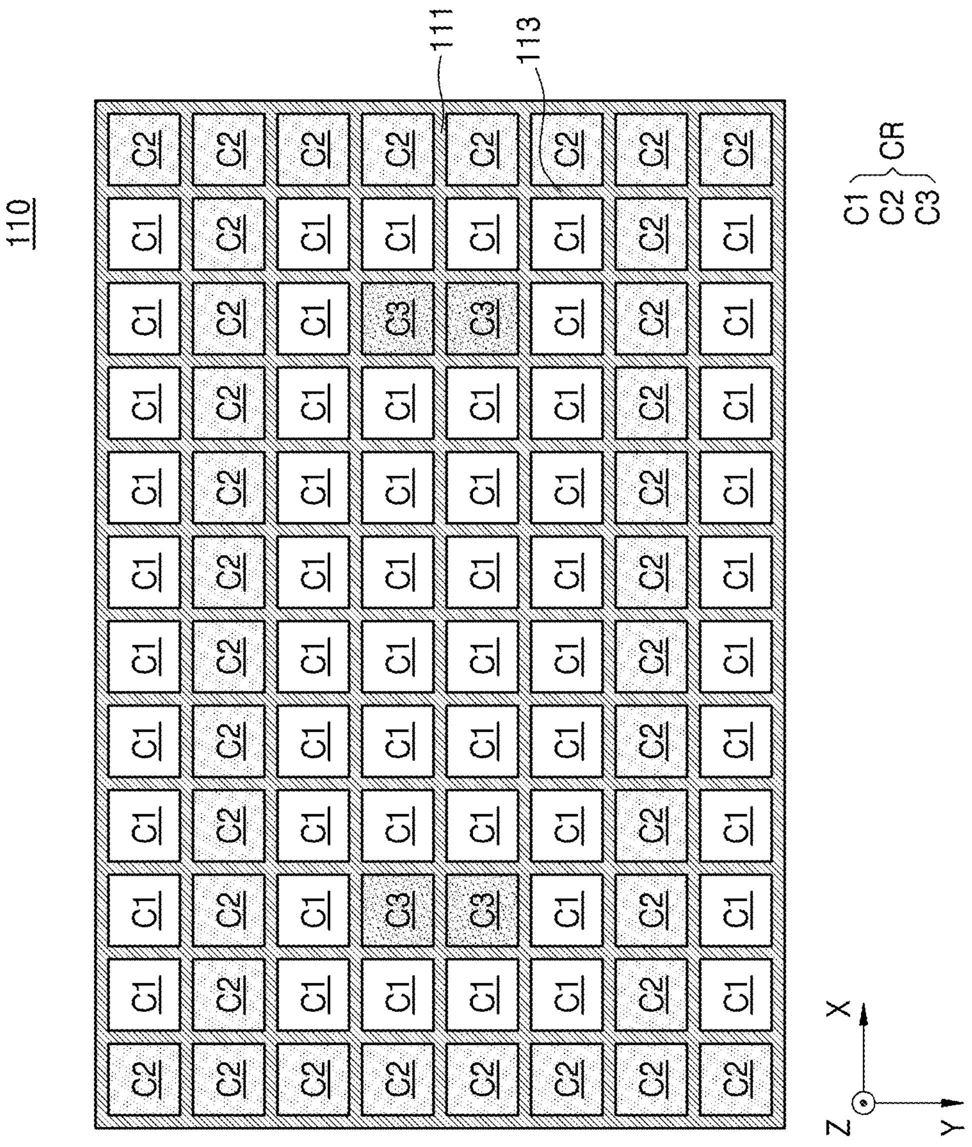
FIG. 2 is a plan view showing a travel rail of the article transfer and storage apparatus according to some example embodiments.

FIG. 1 is a configuration diagram showing an article transfer and storage apparatus 10 according to some example embodiments. FIG. 2 is a plan view showing a travel rail 110 of the article transfer and storage apparatus 10 according to some example embodiments.

Referring to FIGS. 1 and 2, the article transfer and storage apparatus 10 may be configured to convey articles WP. In some example embodiments, the article transfer and storage apparatus 10 may be provided in a semiconductor device manufacturing plant and may be configured to convey the articles WP in the semiconductor device manufacturing plant. For example, each of the articles WP may include a container in which a substrate for manufacturing a semiconductor device is accommodated. For example, the article WP may include any one of a sealed container, such as a front open unified pod (FOUP), configured to accommodate a plurality of substrates, a magazine configured to accommodate a plurality of substrates, and/or a tray configured to accommodate a plurality of substrates. In some example embodiments, the article WP may represent a substrate itself.

The article transfer and storage apparatus 10 may be configured to convey or transfer the articles WP between facilities MF installed on the floor BW of the semiconductor device manufacturing plant. The article transfer and storage apparatus 10 may be fixed to the ceiling wall CW of the semiconductor device manufacturing plant, and the articles WP may be conveyed above the facilities MF by the article transfer and storage apparatus 10. The facilities MF may include production facilities configured to perform semiconductor processes on substrates or stockers in which the articles WP are loaded. For example, the production facilities may include facilities configured to perform, on substrates, processes such as a diffusion process, a photolithography process, an etch process, a deposition process, a metallization process, an ion implantation process, a cleaning process, a polishing process, and/or a packaging process. Each of the facilities MF may include a load port LP on which the article WP is loaded.

The article transfer and storage apparatus 10 may include a transfer robot 400, a robot traveling layer 100 in which the transfer robot 400 travels, a storage layer 200 disposed below the robot traveling layer 100 and configured to store the articles WP, and a power supply layer 300 disposed above the robot traveling layer 100 and configured to supply power to the transfer robot 400.

The robot traveling layer 100 may include a travel rail 110 configured to guide the travel of the transfer robot 400. The travel rail 110 may be configured to guide the travel of the transfer robot 400 in a first direction (X direction) and a second direction (Y direction). The travel rail 110 may have a grid structure when viewed in an XY plane. The travel rail 110 may include a plurality of first rails 111 and a plurality of second rails 113. The plurality of first rails 111 may extend in the first direction (X direction) and may be spaced apart from each other in the second direction (Y direction). The plurality of second rails 113 may extend in the second direction (Y direction) and may be spaced apart from each other in the first direction (X direction). The travel of the transfer robot 400 in the first direction (X direction) may be guided by two first rails 111 that are adjacent to each other in the second direction (Y direction) among the plurality of first rails 111. The travel of the transfer robot 400 in the second direction (Y direction) may be guided by two second rails 113 that are adjacent to each other in the first direction (X direction) among the plurality of second rails 113.

The travel rail 110 may include a plurality of cell regions CR that are defined by the plurality of first rails 111 and the plurality of second rails 113. Each of the cell regions CR may be defined as a region that is surrounded by two first rails 111 adjacent to each other in the second direction (Y direction) among the plurality of first rails 111 and two second rails 113 adjacent to each other in the first direction (X direction) among the plurality of second rails 113. Each of the cell regions CR may have a rectangular shape or a square shape in a plan view. The transfer robot 400 is configured to move between two cell regions CR selected from among the plurality of cell regions CR and may move along one of a plurality of movement paths by which the two cell regions CR selected from among the plurality of cell regions CR are connected to each other.

The transfer robot 400 may be provided on the travel rail 110. The transfer robot 400 may hold the article WP and horizontally and vertically convey the article WP. The transfer robot 400 may convey the article WP by moving the article WP from a designated start position to a designated target position on the travel rail 110 while holding the article WP. In addition, the transfer robot 400 may vertically convey the article WP between the travel rail 110 and the storage layer 200 or vertically convey the article WP between the travel rail 110 and the load port LP of the facility MF.

The article transfer and storage apparatus 10 may simultaneously operate a plurality of transfer robots 400 provided on the travel rail 110. Each of the plurality of transfer robots 400 may be configured to communicate with a superordinate system, and operations of the plurality of transfer robots 400 may be controlled by the superordinate system. The superordinate system may also be referred to as a controller. The superordinate system may include memory devices, such as read only memory (ROM) and random access memory (RAM), in which various programming instructions are stored, and processors, such as a microprocessor, a central processing unit (CPU), and/or a graphics processing unit (GPU), which are configured to process the programming instructions stored in the memory devices and signals provided from the outside. In addition, the superordinate system may include a receiver and a transmitter for receiving and transmitting electrical signals therebetween.

The transfer robot 400 may receive information about the start position and the target position from the superordinate system and move from the start position to the target position on the basis of the information transmitted from the superordinate system. The start position may have XY coordinates corresponding to any one of the plurality of cell regions CR and the target position may have XY coordinates corresponding to another one of the plurality of cell regions CR. The superordinate system may determine one of a plurality of paths extending from the designated start position to the designated target position, and the transfer robot 400 may travel from the start position to the target position along the path transmitted from the superordinate system. In some example embodiments, the transfer robot 400 may search for a plurality of paths on the basis of the start position and the target position transmitted from the superordinate system and may determine an optimized path among the plurality of found paths. When another transfer robot 400 is detected on the path along which the transfer robot 400 travels toward the target position, the transfer robot 400 may travel along a bypass created by the superordinate system or the transfer robot 400 itself. The travel rail 110 having the grid structure generates a plurality of paths between the start position and the target position, and thus, the superordinate system may generate an optimized path capable of minimizing congestion of the transfer robot 400 among the plurality of paths.

The transfer robot 400 may include a robot body 411, a gripper 421, a hoist mechanism 425, a first tag reader 415, a fall prevention structure 417, and a particle collector 419.

The robot body 411 may include a frame forming the exterior of the transfer robot 400 and various components mounted in the frame. Driving wheels 413 connected to a driving motor may be provided on the bottom of the robot body 411. In some example embodiments, the driving wheels 413 may include wheels for travel in the first direction (X direction) and wheels for travel in the second direction (Y direction).

The gripper 421 may grip and hold the article WP. For example, the gripper 421 may be driven by an actuator and configured to switch between a grip orientation for gripping the article WP and an un-grip orientation for releasing the gripped article WP. The gripper 421 may be configured to: switch from the un-grip orientation to the grip orientation so that the article WP is loaded on the transfer robot 400; maintain the grip orientation so that the article WP is held by the transfer robot 400 while the article WP is conveyed by the transfer robot 400; and switch from the grip orientation to the un-grip orientation so that the article WP is conveyed from the transfer robot 400 to a target position.

The hoist mechanism 425 is connected to the gripper 421 and may move the gripper 421 in the vertical direction (Z direction). The hoist mechanism 425 may include a wire connected to the gripper 421 and a motor for controlling winding and unwinding of the wire. The hoist mechanism 425 may move the gripper 421 upward by winding the wire and may move the gripper 421 downward by unwinding the wire.

The first tag reader 415 may sense an identification tag provided on the article WP. The identification tag of the article WP may include a radio frequency identification (RFID) tag, a QR code, or a barcode, but example embodiments are not limited thereto. The first tag reader 415 may identify the identification tag of the article WP to check the information of the article WP, the location of the article WP, whether or not the article WP is loaded by the transfer robot 400, and the like.

The fall prevention structure 417 may be in contact with and support the article WP gripped by the gripper 421. For example, the fall prevention structure 417 may support the side surfaces of the article WP gripped by the gripper 421 and may thus prevent the article WP from falling, being damaged, or shaking during the conveyance of the article WP. The fall prevention structure 417 may include: at least one supporting rod configured to switch between a support position for supporting the article WP and a standby position spaced apart from the support position; and a motor for driving the at least one supporting rod.

The particle collector 419 may be provided on the bottom of the robot body 411. The particle collector 419 may suction and collect particles around the transfer robot 400 and/or the travel rail 110. The particle collector 419 may include a collection box in the robot body 411 and a suction device for suctioning particles. The suction device may be provided in the form of a suction fan or a suction pump. The particles suctioned by operating the suction device may be collected in the collection box.

In some example embodiments, the article transfer and storage apparatus 10 may further include a cleaning robot having a cleaning function. Like the transfer robot 400, the cleaning robot may be configured to travel along the travel rail 110 in the first direction (X direction) and the second direction (Y direction). The cleaning robot may be configured to perform a cleaning task but may not convey the article WP. The cleaning robot may include a particle collector configured to suction and collect particles around the travel rail 110. The particle collector of the cleaning robot may be substantially the same as the particle collector 419 of the transfer robot 400.

The storage layer 200 may provide a space for storing the article WP. The storage layer 200 may include a plurality of storage shelves 210 configured to support and store the articles WP. Each of the storage shelves 210 may include a shelf plate 227, a purge gas supply 221, a second tag reader 223, and a support pin 225.

The shelf plate 227 may be fixed below the travel rail 110 by a connection frame. The shelf plate 227 may have a planar area sufficient to store one article WP.

The purge gas supply 221 may be configured to inject a purge gas into a space provided in the article WP placed on the shelf plate 227. Here, the article WP may include a container, for example, a sealed container such as a FOUP. The purge gas may include, for example, nitrogen or clean dry air. The purge gas supply 221 may include a purge gas source in which the purge gas is stored and an injector for injecting the purge gas provided from the purge gas source into the article WP. When the article WP is accurately placed at a designated position on the shelf plate 227, the injector of the purge gas supply 221 may be connected to a gas injection port of the article WP. In some example embodiments, each of the storage shelves 210 may further include a discharge unit for discharging the gas from the space inside the article WP.

The second tag reader 223 may sense the identification tag provided on the article WP. The second tag reader 223 identifies the identification tag of the article WP placed on the shelf plate 227 and may thus check the information of the article WP, the location of the article WP, whether or not the article WP is loaded by the shelf plate 227, and the like.

The support pin 225 is provided on the shelf plate 227 and may support the article WP so that the article WP is fixed at a designated position on the shelf plate 227. The support pin 225 may include a kinematic coupling pin. The number of support pins 225 suitably arranged to support the article WP may be provided on the shelf plate 227.

The power supply layer 300 may provide power for charging a battery 440 (see FIG. 4) of the transfer robot 400. The battery 440 of the transfer robot 400 may be wirelessly charged by the power provided from the power supply layer 300. More specifically, the power supply layer 300 includes a plurality of power transmission rails 310, and the transfer robot 400 may include a power receiving block 430 configured to charge the battery 440 by interacting with any one of the plurality of power transmission rails 310. The battery 440 of the transfer robot 400 may be configured to be charged by a magnetic induction method, but the example embodiment is not limited thereto. The battery 440 of the transfer robot 400 may be configured to be charged by a magnetic resonance method or an electromagnetic wave method.

The plurality of cell regions CR provided by the travel rail 110 may include a first cell region C1 vertically overlapping the load port LP of the facility MF and a second cell region C2 vertically overlapping the storage shelves 210. The first cell region C1 may vertically overlap a loading/unloading space 240 provided between the storage shelves 210 and the load port LP of the facility MF. When the transfer robot 400 loads the article WP onto or unloads the article WP from the load port LP of the facility MF, the transfer robot 400 may be located in the first cell region C1 that vertically overlaps the load port LP of the corresponding facility MF. When the transfer robot 400 loads the article WP onto or unloads the article WP from the storage shelf 210, the transfer robot 400 may be located in the second cell region C2 that vertically overlaps the corresponding storage shelf 210.

The plurality of cell regions CR provided by the travel rail 110 may include a third cell region C3 through which components (e.g., pipes) connected to the facility MF pass. In order to prevent the transfer robot 400 from colliding with the components connected to the facility MF, the transfer robot 400 may be configured to travel while avoiding the third cell region C3. In some example embodiments, one or more third cell regions C3 may be provided. In some example embodiments, the third cell region C3 may be omitted.

Here, the number and arrangement of the first to third cell regions C1, C2, and C3 illustrated in FIG. 2 is an example, and the number and arrangement of the first to third cell regions C1, C2, and C3 may be appropriately changed according to the layout of a semiconductor manufacturing plant, such as the arrangement of facilities MF.

Figure 3:
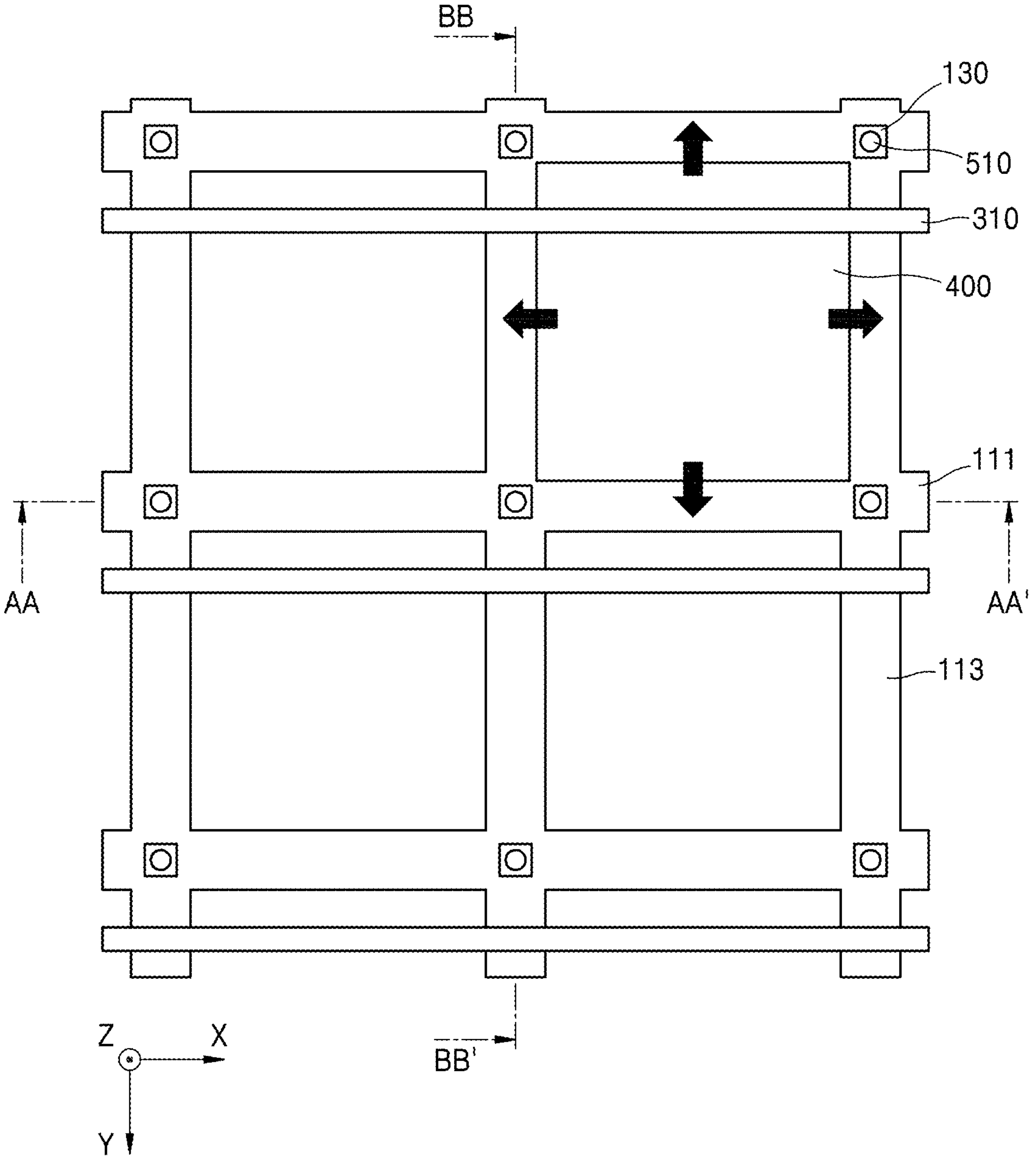
FIG. 3 is a plan view showing a portion of the article transfer and storage apparatus according to some example embodiments.
Figure 4:
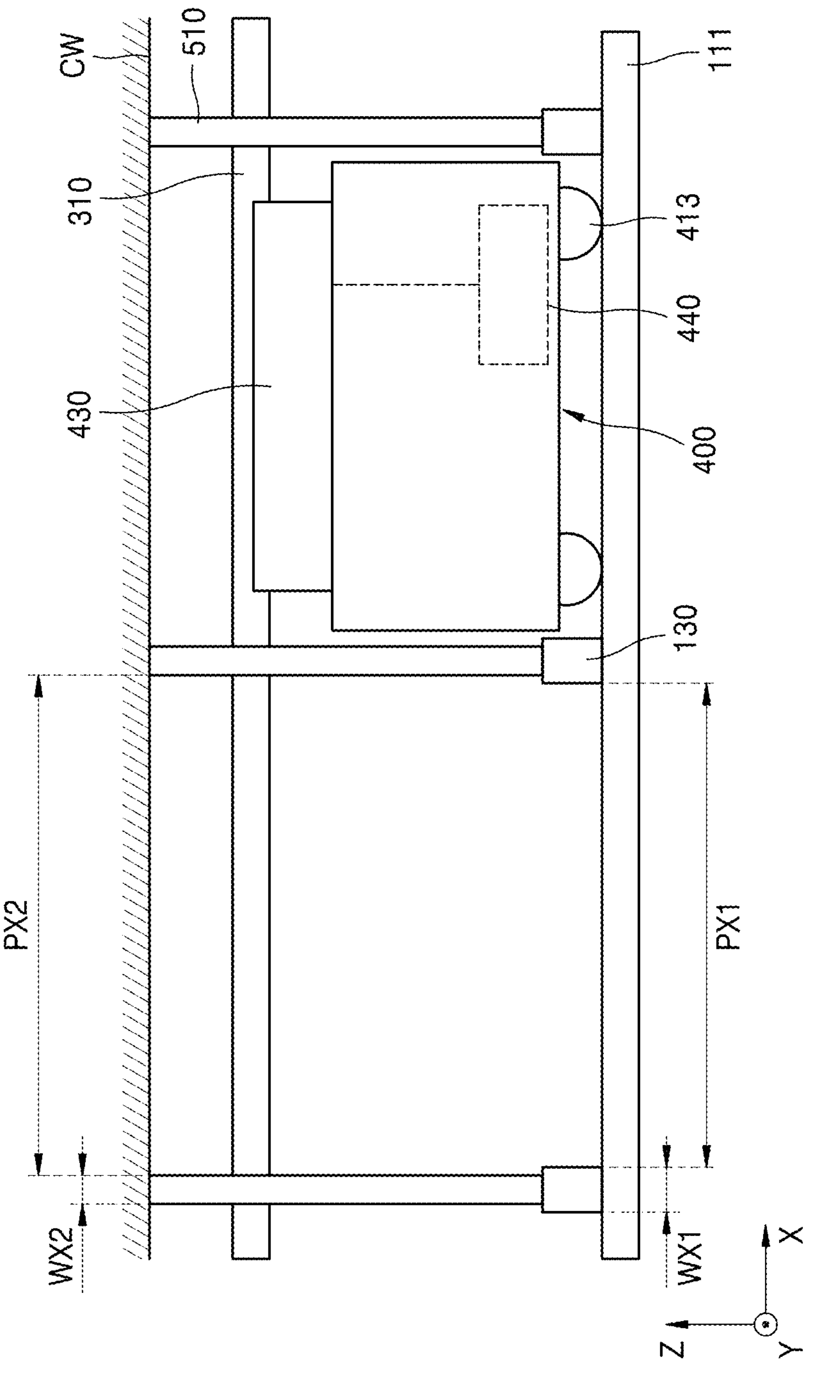
FIG. 4 is a cross-sectional view taken along line AA-AA' of FIG. 3.
Figure 5:
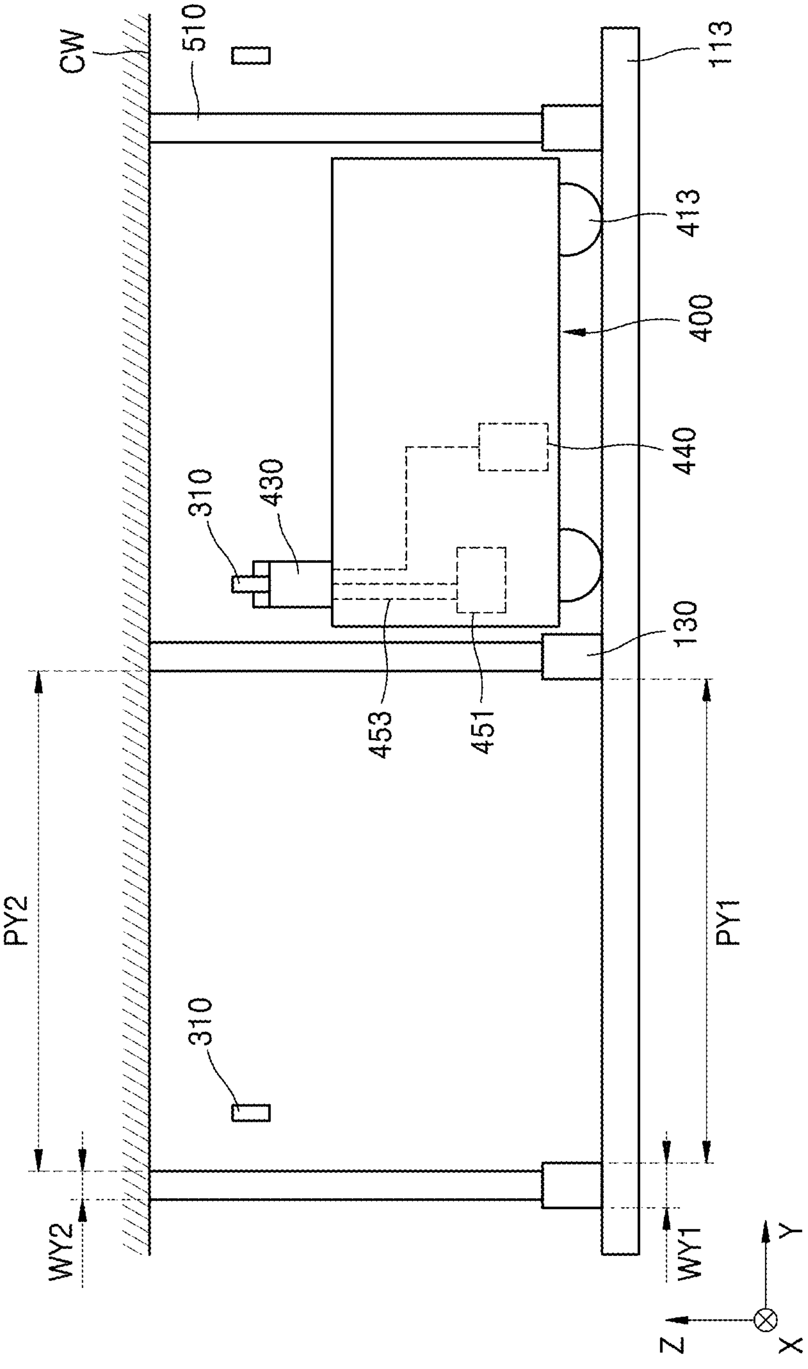
FIG. 5 is a cross-sectional view taken along line BB-BB' of FIG. 3.

FIG. 3 is a plan view showing a portion of the article transfer and storage apparatus 10 according to some example embodiments. FIG. 4 is a cross-sectional view taken along line AA-AA' of FIG. 3. FIG. 5 is a cross-sectional view taken along line BB-BB' of FIG. 3.

Referring to FIGS. 1 and 3 to 5, the travel rail 110 may be fixed to the ceiling wall CW by hanging posts 510. The hanging posts 510 may linearly extend from intersections between the plurality of first rails 111 and the plurality of second rails 113 to the ceiling wall CW. The hanging posts 510 may be connected only to some of the intersections of the plurality of first rails 111 and the plurality of second rails 113 or may be connected to all the intersections between the plurality of first rails 111 and the plurality of second rails 113. A lower end of each of the hanging posts 510 may be coupled to any one of the intersections between the plurality of first rails 111 and the plurality of second rails 113, and an upper end of each of the hanging posts 510 may be coupled to the ceiling wall CW.

The robot traveling layer 100 may include guide blocks 130 that are arranged between the travel rail 110 and the hanging posts 510. Each of the guide blocks 130 may be located between the corresponding one hanging post 510 and any one of the intersections between the plurality of first rails 111 and the plurality of second rails 113. The guide blocks 130 are arranged on the upper surface of the travel rail 110, and the vertical level of the upper surface of each of the guide blocks 130 may be higher than the vertical level of the upper surface of the travel rail 110.

The guide blocks 130 may guide the movement of the transfer robot 400 that travels on the travel rail 110 in the first direction (X direction) and the second direction (Y direction). The vertical length of each of the guide blocks 130 may be determined such that each of the guide blocks 130 may be in contact with the side surface of the transfer robot 400. For example, while the transfer robot 400 travels, the transfer robot 400 is guided by the side surfaces of the guide blocks 130. Accordingly, it is possible to prevent the transfer robot 400 from deviating from a set path.

In addition, the guide blocks 130 may prevent physical interference or collision between the transfer robot 400 and the hanging posts 510. In order to prevent the physical interference or collision between the transfer robot 400 and the hanging posts 510, each of the hanging posts 510 may be connected to the center of the upper surface of the corresponding guide block 130. Also, the dimension of each of the hanging posts 510 in the horizontal direction may be smaller than the dimension of the guide block 130 in the horizontal direction. In some example embodiments, a horizontal width WX1 of each of the guide blocks 130 in the first direction (X direction) may be greater than a horizontal width WX2 of each of the hanging posts 510 in the first direction (X direction). In some example embodiments, a distance PX1 in the first direction (X direction) between two guide blocks 130 adjacent to each other in the first direction (X direction) may be less than a distance PX2 in the first direction (X direction) between two hanging posts 510 adjacent to each other in the first direction (X direction). In some example embodiments, a horizontal width WY1 of each of the guide blocks 130 in the second direction (Y direction) may be greater than a horizontal width WY2 of each of the hanging posts 510 in the second direction (Y direction). In some example embodiments, a distance PY1 in the second direction (Y direction) between two guide blocks 130 adjacent to each other in the second direction (Y direction) may be less than a distance PY2 in the second direction (Y direction) between two hanging posts 510 adjacent to each other in the second direction (Y direction).

Figure 6:
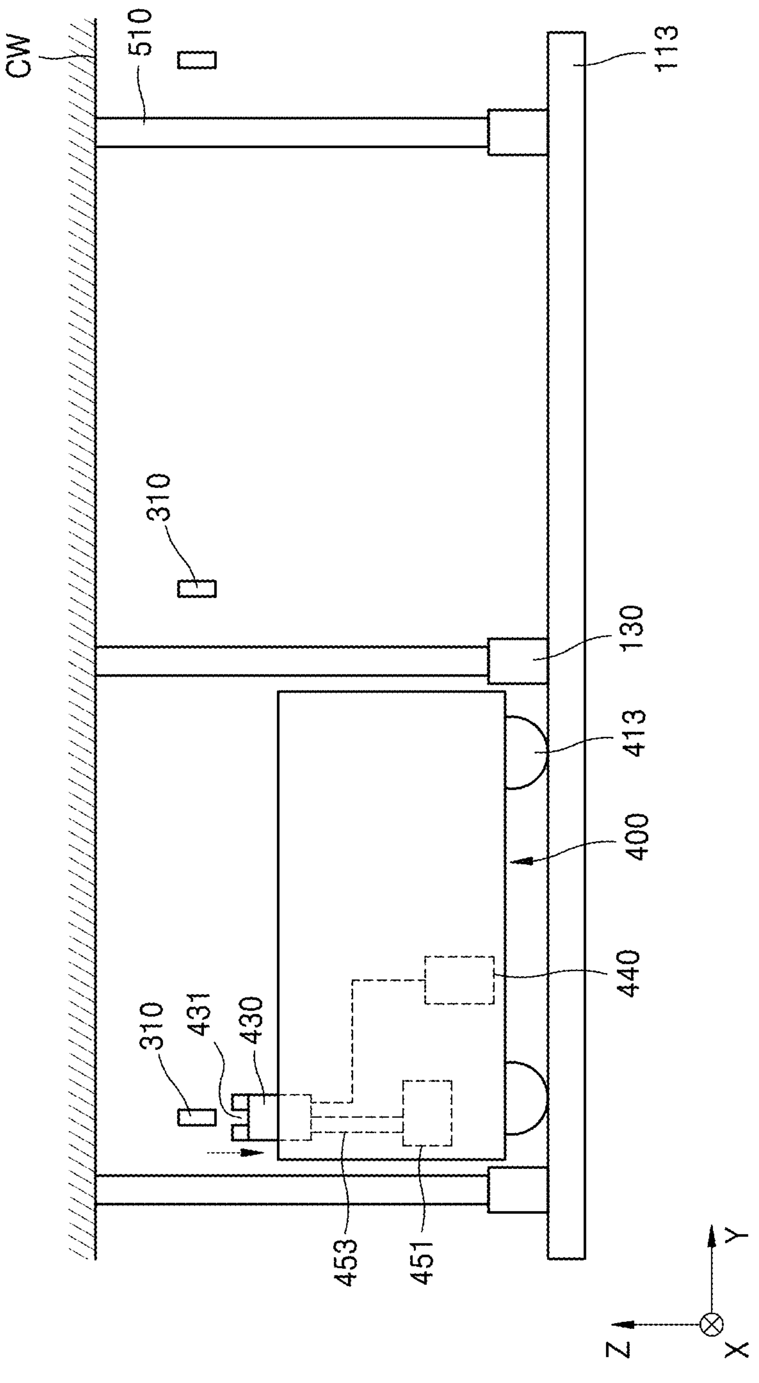
FIGS. 6 and 7 are cross-sectional views showing a portion of the article transfer and storage apparatus according to some example embodiments.
Figure 7:
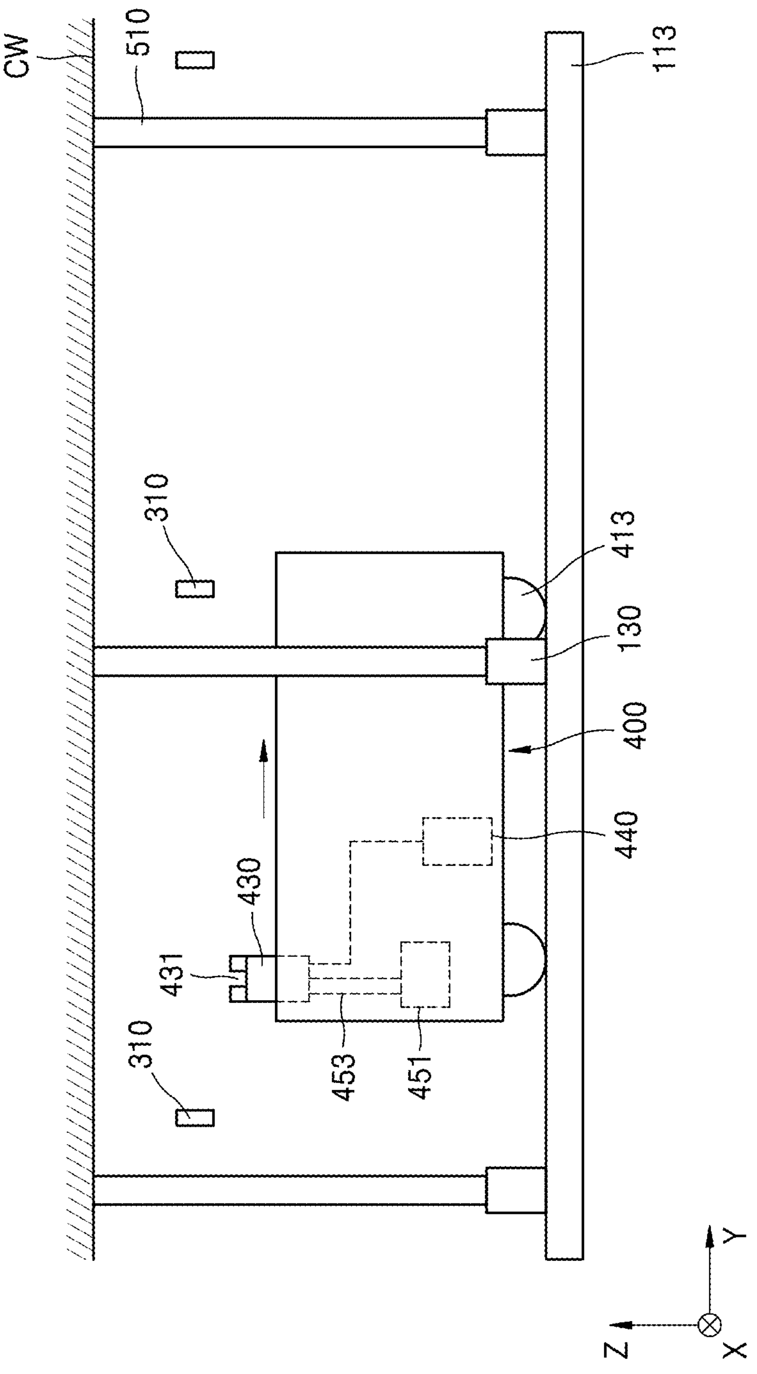

FIGS. 6 and 7 are cross-sectional views showing a portion of the article transfer and storage apparatus 10 according to some example embodiments.

Hereinafter, a method of wirelessly charging the transfer robot 400 in the article transfer and storage apparatus 10 is described with reference to FIGS. 3 to 7.

The plurality of power transmission rails 310 may extend in the first direction (X direction) and may be spaced apart from each other in the second direction (Y direction). When a set of cell regions CR of the travel rail 110 arranged in the first direction (X direction) is defined as constituting one column of cell regions CR, one power transmission rail 310 may be provided over the one column of cell regions CR. While the power receiving block 430 of the transfer robot 400 is at a distance suitable for wireless charging from the power transmission rail 310, the battery 440 of the transfer robot 400 may be charged by an electromagnetic induction phenomenon that is generated between the power receiving block 430 of the transfer robot 400 and the power transmission rail 310. That is, an induced current is formed in a coil built in the power receiving block 430 by a magnetic field that is formed around the power transmission rail 310, and the battery 440 of the transfer robot 400 may be charged by this induced current.

In some example embodiments, the power receiving block 430 may include a groove 431 that accommodates the power transmission rail 310. The groove 431 is provided in the upper portion of the power receiving block 430 and may extend parallel to the power transmission rail 310. In a plan view, the groove 431 may linearly extend in the first direction (X direction) from one side to the other side of the power receiving block 430.

The transfer robot 400 may include an actuator 451 configured to move the power receiving block 430. In some example embodiments, the actuator 451 may lift or lower the power receiving block 430 in the vertical direction (Z direction) by lifting or lowering a connecting rod 453 connected to the power receiving block 430. In some example embodiments, the actuator 451 may control the position of the power receiving block 430 between a first vertical level and a second vertical level that is lower than the first vertical level. When the power receiving block 430 is at the first vertical level, the distance between the power receiving block 430 and the power transmission rail 310 may be within a charging distance in which the battery 440 is wirelessly charged by interaction between the power receiving block 430 and the power transmission rail 310. When the power receiving block 430 is at the second vertical level, the upper end of the power receiving block 430 may be below the power transmission rail 310. In some example embodiments, when the power receiving block 430 is at the second vertical level, the power receiving block 430 may be entirely located inside a frame of the transfer robot 400.

Referring to FIGS. 4 and 5, when the transfer robot 400 moves in the first direction (X direction), the battery 440 of the transfer robot 400 is continuously charged by the electromagnetic induction phenomenon between the power transmission rail 310 and the power receiving block 430 while the transfer robot 400 moves in the first direction (X direction). While the transfer robot 400 moves in the first direction (X direction), the power receiving block 430 may be at the first vertical level, and at least a portion of the power transmission rail 310 may be accommodated in the groove 431 of the power receiving block 430. While the transfer robot 400 moves in the first direction (X direction), the power receiving block 430 may be configured to slide along the power transmission rail 310.

Referring to FIGS. 6 and 7, when the transfer robot 400 switches from movement in the first direction (X direction) to movement in the second direction (Y direction), the power receiving block 430 may descend from the first vertical level to the second vertical level. While the transfer robot 400 moves in the second direction (Y direction), the vertical position of the power receiving block 430 may be maintained at the second vertical level. The power receiving block 430 is at the second vertical level, and thus, it is possible to prevent the power receiving block 430 from physically interfering or colliding with another structure, such as the power transmission rail 310, while the transfer robot 400 moves in the second direction (Y direction). While the transfer robot 400 moves in the second direction (Y direction), the battery 440 of the transfer robot 400 is not wirelessly charged, but the transfer robot 400 may be moved by the power that has been charged in the battery 440. In addition, when the transfer robot 400 finishes moving in the second direction (Y direction), the power receiving block 430 may ascend from the second vertical level to the first vertical level so that the battery 440 is wirelessly charged as illustrated in FIG. 5.

According to some example embodiments, the travel rail 110 having the grid structure may provide a plurality of conveyance paths from a designated start position to a designated target position. Also, it is possible to improve an article conveyance efficiency by selecting a path that minimizes congestion of the transfer robots 400 and operating the plurality of transfer robots 400.

Also, according to some example embodiments, the storage shelves 210 capable of storing articles may be arranged below the travel rail 110. The storage shelves 210 may replace stockers installed on the floor of the semiconductor device manufacturing plant, thereby improving the space utilization of the semiconductor device manufacturing plant.

Also, according to some example embodiments, the battery 440 of the transfer robot 400 may be charged using the plurality of power transmission rails 310 that are provided above the travel rail 110. The charging of the battery 440 of the transfer robot 400 may be performed in parallel with the conveyance of the transfer robot 400, and thus, non-operation time required for charging the transfer robot 400 may be eliminated. Accordingly, it is possible to improve the article conveyance efficiency.

While the inventive concept has been particularly shown and described with reference to some example embodiments thereof, it will be understood that various changes in form and details may be made therein without departing from the spirit and scope of the following claims.

What is claimed is:

1. An article transfer and storage apparatus comprising:

a travel rail including, a plurality of first rails extending in a first direction and spaced apart from each other in a second direction perpendicular to the first direction, and a plurality of second rails extending in the second direction and spaced apart from each other in the first direction;

a plurality of power transmission rails disposed above the travel rail, extending in the first direction, and spaced apart from each other in the second direction;

a transfer robot that is configured to move on the travel rail in the first direction and the second direction to convey an article, the transfer robot including a battery charged by power provided from the plurality of power transmission rails, the transfer robot configured to selectively couple and decouple the battery to the plurality of power transmission rails such that the battery is charged in response to the transfer robot coupling the battery to the plurality of power transmission rails; and storage shelves disposed below the travel rail.

2. The article transfer and storage apparatus of claim 1, wherein the travel rail includes a plurality of cell regions defined by the plurality of first rails and the plurality of second rails, each of the plurality of cell regions is defined by two first rails adjacent to each other in the second direction among the plurality of first rails and two second rails adjacent to each other in the first direction among the plurality of second rails, and the plurality of cell regions includes, first cell regions vertically overlapping ports of facilities on which the article is configured to be loaded, and second cell regions vertically overlapping the storage shelves.

3. The article transfer and storage apparatus of claim 2, wherein the plurality of cell regions further includes at least one third cell region through which a pipe connected to at least one of the facilities passes, and the transfer robot is configured to travel and avoid the at least one third cell region.

4. The article transfer and storage apparatus of claim 2, wherein each of the plurality of cell regions has a quadrangular shape in a plan view.

5. The article transfer and storage apparatus of claim 1, further comprising:
- hanging posts connected to intersections between the plurality of first rails and the plurality of second rails, the hanging posts configured to fix the travel rail to a ceiling wall; and
- guide blocks arranged between the travel rail and the hanging posts and configured to guide the transfer robot.

6. The article transfer and storage apparatus of claim 5, wherein a width of each of the guide blocks is greater than a width of each of the hanging posts.

7. The article transfer and storage apparatus of claim 1, wherein
- the article comprises a container configured to accommodate a substrate, and
- each of the storage shelves includes,
  - a purge gas supply configured to inject a purge gas into the container;
  - a tag reader configured to identify an identification tag of the container; and
  - a support pin configured to support the container.

8. The article transfer and storage apparatus of claim 1, wherein the transfer robot further includes a power receiving block configured to charge the battery with power provided from the plurality of power transmission rails.

9. The article transfer and storage apparatus of claim 8, wherein
- the power receiving block is configured to slide along any one of the plurality of power transmission rails in response to the transfer robot moving in the first direction, and
- the battery of the transfer robot is configured to be continuously charged by electromagnetic induction generated between the power receiving block and the plurality of power transmission rails in response to the transfer robot moving in the first direction.

10. The article transfer and storage apparatus of claim 9, wherein the transfer robot further includes,
- an actuator configured to lift or lower the power receiving block, the actuator is configured to:
  - position the power receiving block at a first vertical level at which the battery is wirelessly charged in response to the transfer robot moving in the first direction, and
  - position the power receiving block at a second vertical level to avoid physical collision between the power receiving block and the plurality of power transmission rails in response to the transfer robot moving in the second direction.

11. The article transfer and storage apparatus of claim 9, wherein the power receiving block includes a groove for accommodating any one of the plurality of power transmission rails.

12. The article transfer and storage apparatus of claim 1, wherein the transfer robot further includes,
- a tag reader configured to identify an identification tag of the article;
- a gripper configured to hold the article;
- a hoist mechanism configured to move the gripper; and
- a fall prevention structure configured to physically support the article held by the gripper.

13. The article transfer and storage apparatus of claim 1, wherein the transfer robot further includes a particle collector.

14. An article transfer and storage apparatus comprising:
- a travel rail including,
  - a plurality of first rails extending in a first direction and spaced apart from each other in a second direction perpendicular to the first direction, and
  - a plurality of second rails extending in the second direction and spaced apart from each other in the first direction;
- a plurality of power transmission rails disposed above the travel rail, extending in the first direction, and spaced apart from each other in the second direction; and
- a transfer robot configured to move on the travel rail in the first direction and the second direction, the transfer robot including a battery, a power receiving block, and a gripper for holding an article,
- wherein the battery of the transfer robot is configured to be continuously charged by electromagnetic induction generated between the power receiving block and the plurality of power transmission rails in response to the transfer robot moving in the first direction.

15. The article transfer and storage apparatus of claim 14, wherein the transfer robot further comprises an actuator configured to lift or lower the power receiving block, and
- the actuator is configured to:
- position the power receiving block at a first vertical level at which the battery is wirelessly charged in response to the transfer robot moving in the first direction; and
- position the power receiving block at a second vertical level in response to the transfer robot moving in the second direction.

16. The article transfer and storage apparatus of claim 15, wherein the power receiving block includes a groove configured to accommodate any one of the plurality of power transmission rails, and
- the power receiving block configured to slide along any one of the plurality of power transmission rails in response to the transfer robot moving in the first direction.

17. The article transfer and storage apparatus of claim 14, further comprising:
- hanging posts configured to fix the travel rail to a ceiling wall; and
- storage shelves which are disposed below the travel rail and each of which is configured to store the article.

18. The article transfer and storage apparatus of claim 17, wherein the travel rail includes a plurality of cell regions defined by the plurality of first rails and the plurality of second rails, the plurality of cell regions includes,
- first cell regions vertically overlapping ports of facilities on which the article is loaded;
- second cell regions vertically overlapping the storage shelves; and
- at least one third cell region through which a pipe connected to at least one of the facilities passes,
- wherein the transfer robot is configured to travel and avoid the at least one third cell region.

19. An article transfer and storage apparatus comprising:
- a travel rail that includes,
  - a plurality of first rails extending in a first direction and spaced apart from each other in a second direction perpendicular to the first direction,
  - a plurality of second rails extending in the second direction and spaced apart from each other in the first direction, and
  - a plurality of cell regions defined by the plurality of first rails and the plurality of second rails, wherein the travel rail is fixed to a ceiling wall by hanging posts;

a plurality of power transmission rails disposed above the travel rail, extending in the first direction, and spaced apart from each other in the second direction;

a transfer robot configured to move on the travel rail in the first direction and the second direction; and storage shelves disposed below the travel rail, wherein the transfer robot includes, a gripper configured to grip an article;

a hoist mechanism configured to move the gripper in a vertical direction;

a first tag reader configured to identify an identification tag of the article;

a fall prevention structure configured to physically support the article held by the gripper;

a particle collector configured to suction and collect particles;

a power receiving block;

a battery that is configured to be charged by electromagnetic induction generated between the power receiving block and the plurality of power transmission rails; and an actuator configured to move the power receiving block in the vertical direction between a first vertical level and a second vertical level, and wherein each of the storage shelves includes, a shelf plate on which the article is placed;

a purge gas supply configured to inject a purge gas into the article;

a second tag reader configured to identify the identification tag of the article; and a support pin provided on the shelf plate and configured to support the article.

20. The article transfer and storage apparatus of claim 19, wherein each cell region of the plurality of cell regions is defined by two first rails adjacent to each other in the second direction among the plurality of first rails and two second rails adjacent to each other in the first direction among the plurality of second rails, and each of the plurality of cell regions has a quadrangular shape, wherein the plurality of cell regions includes, first cell regions vertically overlapping ports of facilities on which the article is loaded;

second cell regions vertically overlapping the storage shelves; and at least one third cell region through which a pipe connected to at least one of the facilities passes, and wherein the transfer robot is configured to travel and avoid the at least one third cell region.

* * * * *